(12) United States Patent
Piscevic

(10) Patent No.: US 6,395,454 B1
(45) Date of Patent: May 28, 2002

(54) INTEGRATED ELECTRICAL CIRCUIT WITH PASSIVATION LAYER

(75) Inventor: Darko Piscevic, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/498,532

(22) Filed: Feb. 4, 2000

Related U.S. Application Data

(63) Continuation of application No. PCT/DE98/02236, filed on Aug. 4, 1998.

(30) Foreign Application Priority Data

Aug. 4, 1997 (DE) .......................................... 197 33 731

(51) Int. Cl.⁷ .......................... G03F 7/00; H01L 21/312
(52) U.S. Cl. ........................ 430/311; 430/314; 430/3.8; 427/58; 428/338
(58) Field of Search ................................. 430/311, 314, 430/318; 427/58; 428/338, 411.1

(56) References Cited

U.S. PATENT DOCUMENTS

| | | | |
|---|---|---|---|
| 4,230,754 A | 10/1980 | Maher et al. ................. | 428/76 |
| 5,017,975 A * | 5/1991 | Ogawa ........................... | 357/8 |
| 5,264,731 A | 11/1993 | Tamura et al. .............. | 257/791 |
| 5,429,708 A | 7/1995 | Linford et al. ................ | 216/66 |
| 5,545,432 A | 8/1996 | DeGuire et al. ............ | 427/226 |
| 6,096,497 A * | 8/2000 | Bauer ............................ | 435/4 |

FOREIGN PATENT DOCUMENTS

| | | |
|---|---|---|
| DE | 40 21 197 A1 | 1/1992 |
| DE | 692 16 926 T2 | 1/1997 |
| EP | 0 492 417 A2 | 7/1992 |
| EP | 0 511 657 A2 | 11/1992 |
| JP | 06-041183 A | 2/1994 |

OTHER PUBLICATIONS

Patent Abstracts of Japan No. 02–310922 (Tetsuo), dated Dec. 26, 1990.

* cited by examiner

*Primary Examiner*—Mark F. Huff
*Assistant Examiner*—Nicole Barreca
(74) *Attorney, Agent, or Firm*—Herbert L. Lerner; Laurence A. Greenberg; Werner H. Stemer

(57) ABSTRACT

The invention relates to an integrated electric circuit comprising a metal layer provided with a passivation layer. The passivation layer is made of a monomolecular film which is placed on the surface of the metal layer. The monomolecular film is formed prior to contacting the metal layer with metal wires. The wires are pushed through the passivation layer with a force strong enough to pierce the monomolecular film. In the alternative, the film may be selectively removed at defined locations in preparation for the contacting with the wires.

6 Claims, 2 Drawing Sheets

INTEGRATED ELECTRICAL CIRCUIT WITH PASSIVATION LAYER

CROSS-REFERENCE TO RELATED APPLICATION

This is a continuation of International Application PCT/DE98/02236 now WO 99/08317, filed Aug. 4, 1998, which designated the United States.

BACKGROUND OF THE INVENTION

FIELD OF THE INVENTION

The invention lies in the semiconductor technology field. More specifically, the invention relates to a process for the production of an integrated electrical circuit, in which one or more dielectric layers and one or more structured semiconductor layers as well as at least one metal plane are applied on a substrate. A monomolecular film, made up of molecules which contain at least one anchoring group, is applied as a passivation layer to the metal plane by wetting the metal plane with a solution. Metal wires are connected to the metal plane.

It is known in the art that integrated electrical circuits, which contain a metal plane, can be protected against corrosion and mechanical damage by providing the metal plane with a passivation layer.

Dielectrics (e.g. silicon nitride: $Si_3N_4$) and metal passivations (e.g. titanium, tantalum, aluminum, palladium) have to date been used as diffusion and oxidation barriers.

In order to buffer against mechanical stresses, it has been found effective to provide these passivation layers with an additional organic layer, in particular a polymer layer. The thickness of the polymer layer is at least one micron (1 $\mu$m). Other organic protective layers also have a defined minimum thickness of preferably more than 200 nm.

The prior art passivation layers are used in the large-scale fabrication of integrated circuits. In prolonged operation or under high operating temperatures, however, instabilities occur which may lead to a rupture of the passivation layer. A further disadvantage of these passivation layers is the impediment caused by them when making contact with the metal plane using connection wires. It is hence necessary, before making contact, to apply a mask (by depositing resist, exposing and developing), and subsequently to treat the contact locations using anisotropic metal etching.

Japanese patent application JP-A-6041183 discloses a metal surface of a biosensor. A surface of the biosensor is covered with a monomolecular layer.

Such monomolecular layers are used as passivation layers for integrated semiconductor circuits. U.S. Pat. No. 5,264,731 discloses an integrated semiconductor circuit whose surface is first covered with a monomolecular passivation layer and then enclosed with a synthetic resin.

SUMMARY OF THE INVENTION

The object of the invention is to provide a process for the production of an integrated electrical circuit which overcomes the above-noted deficiencies and disadvantages of the prior art devices and methods of this kind, and in which, on the one hand, the passivation layer is produced in the simplest and most cost-effective way and, on the other hand, the passivation layer does not impede the connection of metal wires to the metal plane. It is a further object to render it possible for the application of the passivation layer to be integrated in the process sequence for the production of the integrated electrical circuit.

With the above and other objects in view there is provided, in accordance with the invention, a method of producing an integrated electrical circuit, which comprises:

forming one or more dielectric layers, one or more structured semiconductor layers, and at least one metal plane on a substrate;

wetting the metal plane with a solution for applying a passivation layer on the metal in the form of a monomolecular film made up of molecules containing an anchoring group; and subsequently connecting a metal wire to the metal plane with a pressure sufficient to pierce the monomolecular film.

In other words, the passivation layer is applied before the metal wires are connected to the metal plane, and the metal wires are connected to the metal plane using a pressure which is sufficient to pierce the monomolecular film.

In accordance with an added feature of the invention, the metal plane is formed of copper, silver, or gold.

In accordance with another feature of the invention, the anchoring group of the molecules of the monomolecular film is a thiol. In a preferred embodiment, the molecules of the monomolecular film are alkanethiol molecules.

In accordance with an additional feature of the invention, the anchoring group of the molecules of the monomolecular film is a sulfide or a disulfide.

With the above and other objects in view there is also provided, in accordance with an alternative feature of the invention, a method of producing an integrated electrical circuit, which comprises:

forming one or more dielectric layers, one or more structured semiconductor layers, and at least one metal plane on a substrate;

wetting the metal plane with a solution for applying thereon a passivation layer in the form of a monomolecular film made up of molecules containing an anchoring group; and subsequently connecting a metal wire to the metal plane by performing the following steps:

energizing the monomolecular film at locations defined for connection to the metal wires in a controlled manner using electromagnetic radiation with an energy great enough for a bonding of the molecules to the metal to be weakened at the locations; and connecting the metal wires to the metal plane at the locations.

In other words, the alternative mode of connecting the wires to the metal layer includes the following process steps:

energy is delivered to the monomolecular film at the locations intended for connection to the metal wires in a controlled way using electromagnetic radiation. The energy is great enough for the bonding of the molecules to the metal to be weakened at these locations; and the metal wires are connected to the metal plane at these "weakened-bond" locations.

In accordance with an added feature of the invention, prior to connecting the metal wires to the metal plane, a solution is applied that has a solvent power sufficient to dissolve the molecules whose bonding to the metal has been weakened in the energizing step.

In accordance with again an added feature of the invention, the film is washed with high-purity deionized water and subsequently dried with nitrogen.

In accordance with again an additional feature of the invention, the film at the specified locations is radiated with UV light.

In accordance with an alternative feature of the invention, the energizing step comprises exposing with an extra-high-pressure mercury lamp.

In accordance with a concomitant feature of the invention, the energizing step comprises exposing with a laser.

In once more summarizing the invention, a film is provided in direct contact with the surface of the metal to act as a passivation layer. Because the film consists of molecules whose adhesion to the metal surface is very strong, it is not possible for any further substances to be taken up. A monomolecular protective film is hence provided.

Such a protective film is distinguished in that it can be formed straightforwardly by dipping the electrical circuit in a solution. It is hence possible to provide more than 100 integrated electrical circuits with the passivation layer in one solvent simultaneously.

Further layers, for example an additional protective film, may be applied to the monomolecular film, although, just the monomolecular film itself is actually sufficient to obtain the desired properties of the passivation layer.

In contrast to the passivations known in the prior art, which have as large a passivation layer thickness as possible, the invention hence proposes that the passivation layer be formed in such a way that it has a minimal thickness and can bond in an ideal way conformally to the surface of the metal.

Such a bond between the metal surface and the film is obtained, according to a particularly advantageous embodiment, in that the monomolecular film consists of molecules which contain an anchoring group. The electrons of this anchoring group can interact with the metal surface. Relevant inter-action mechanisms include both physical adsorption processes as well as covalent and ionic forces.

The effect of the exothermic interaction of the anchoring group with the metal surface is that the molecules contained in solution utilize each binding site on the metal surface. A precondition for this is that the molecules need to be mobile on the surface, in order to offer further binding sites by coalescence. The surface mobility leads to the formation of highly ordered crystalline monolayers.

The molecules consist of an anchoring group, which interacts with the metal surface. This is followed by a nonpolar organic chain which may have both a linear and a branched structure. This organic chain can be substituted in various ways, that is to say the water solubility of the molecule can be increased in a controlled way by the insertion of substituents such as amides or oxygen. Such a molecule suitable for the chemisorption process may further have an end group which not only determines the surface function of the film, but also influences the ordering state, that is to say the molecular structure of the layer.

The organic chains interact with one another. A possible explanation of the intermolecular interaction could be provided by van der Waals forces. The end group points outward. The end group determines the composition of the outward-facing surface of the monomolecular film which is essential for the properties of the passivation layer.

Further molecules may be taken up on the end group, so that a further layer, which imparts additional properties to the passivation layer, can be formed on the monomolecular film.

Because the anchoring groups enter into highly exothermic bonding with the metal surface, and the individual molecules simultaneously interact strongly with one another, the application of the passivation layer leads to displacement of impurities adhering to the metal surface.

The metals may be metals customarily used in the semiconductor industry, in particular copper, gold and silver.

Since the passivation according to the invention is based on an interfacial effect, the metal layer may be as thin as desired.

It is hence also possible for metal layers present inside the integrated electrical circuit to be provided with a passivation layer according to the invention. The passivation layer may particularly advantageously be applied by wetting the metal plane with a solution made up of a solvent and molecules dissolved therein, the dissolved molecules respectively containing at least one anchoring group. This leads to the formation of a monomolecular film on the metal plane.

Through the application of a solution in which the concentration of the molecules in the solvent is at least 0.5 mM, the formation of a complete layer is achieved after as little as a minute.

All the molecules mentioned above are suitable for ensuring the function of diffusion and oxidation barriers as well as good connectability of metal wires to the metal surface.

It is even possible to apply the passivation layer in such a way as to avoid creating environmentally unfriendly waste. This can be done by dissolving water-soluble molecules in water and applying this solution. Molecules with a thiol group have been found to be particularly suitable water-soluble molecules.

The integrated electrical circuits according to the invention can be connected to metal wires in a simple way. This is done in a particularly simple and, at the same time, expedient way by bonding the metal wires to the metal plane, through the film, using a pressure which is sufficient to pierce the monomolecular film.

The process of connection between the metal wires and the metal plane is advantageously integrated in the process sequence for the production of the integrated electrical circuit by delivering energy in a controlled way to the monomolecular film at the locations intended for connection to the metal wires using electromagnetic radiation—preferably using UV light, the energy of the electromagnetic radiation being great enough for the bonding of the molecules to the metal to be weakened at these locations. If appropriate, a solution is then applied whose solvent power is sufficient to dissolve the molecules whose bonding to the metal has been weakened. The metal wires are subsequently connected to the metal plane at these locations.

Other features which are considered as characteristic for the invention are set forth in the appended claims.

Although the invention is illustrated and described herein as embodied in an integrated electrical circuit with passivation layer, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
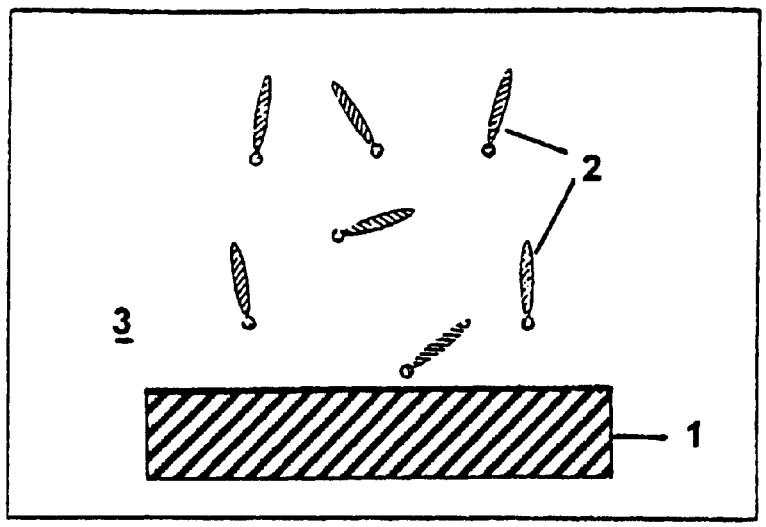
FIG. 1 is a diagrammatic illustration of a detail of an upper metal plane of an integrated electrical circuit in three sequential views 1A, 1B, and 1C.

Referring now to the figures of the drawing in detail and first, particularly, to FIG. 1 thereof, the three sub-images 1A, 1B, 1C show the process of the chemisorption of alkanethiol molecules 2 on a copper layer 1. The alkanethiol molecules have been dissolved in high-purity deionized water so as to form a 0.5 mM thiol solution 3.

FIG. 1A represents what happens immediately after the copper layer 1 is wetted with the solution 3. The thiol molecules 2 move freely in this solution at first. The effect of the exothermic interaction of the head group of the molecules 2 with the upper surface of the copper plane 1 is that the thiol molecules 2 are already oriented in the direction toward the metal surface.

Figure 1B:
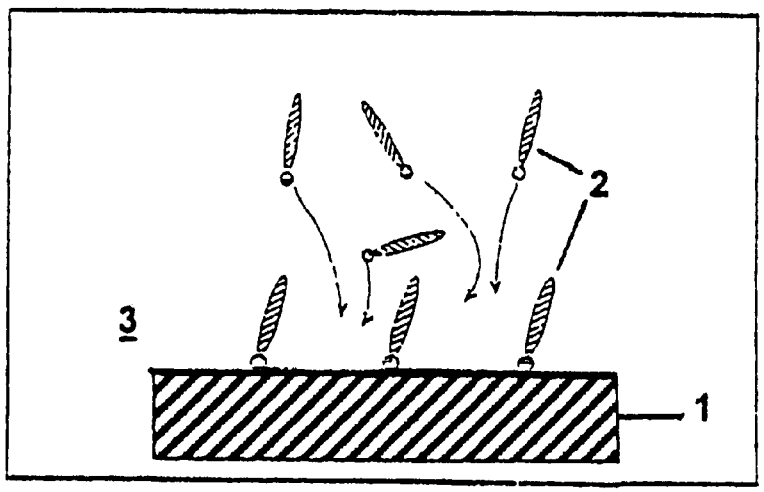

In the next step, which is represented in FIG. 1B, chemisorption of the first thiol molecules between the head or anchoring group and the metal surface has already occurred. In comparison with physical adsorption, chemisorption has substantially stronger bonding forces, the strength of which is commensurate with chemical bonding. It can also be regarded as the formation of surface bonds, the bonding process being irreversible. The van der Waals interaction between the individual thiol molecules causes them to be aligned in parallel. This parallel alignment makes it possible for the as yet unbonded molecules to become arranged on the metal surface between the bonded molecules. Because of the van der Waals interaction, the parallel-aligned molecules move toward one another on the metal surface so that impurities adhering to the surface of the copper are displaced from it.

Figure 1C:
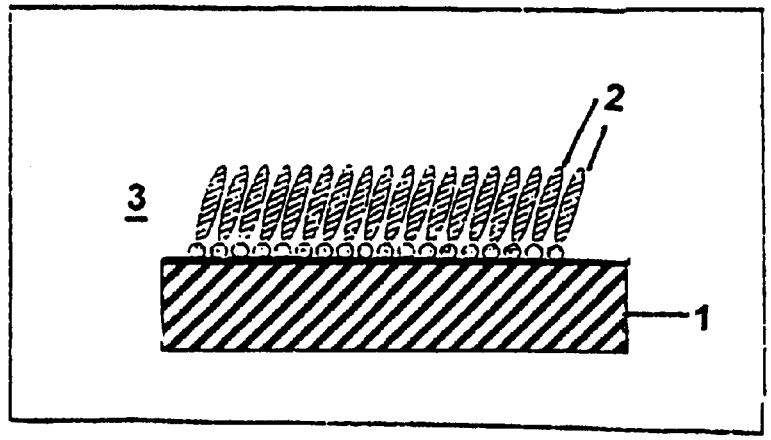

As a result of the relative movement of the molecules 2 toward one another on the surface of the copper plane 1, a continuous film is formed, which is represented in FIG. 1C.

The illustrative embodiment represented relates to the chemisorption of alkanethiol molecules on the metal surface. Of course, yet other molecules which have the same structural make-up and the same interaction properties may nevertheless fulfil the same function. Examples include, in particular, molecules with thiol, sulfide or disulfide groups.

The chemisorption process hence leads to the formation of a continuous uninterrupted passivation layer. This passivation layer combines the advantages of a diffusion and oxidation barrier with high mechanical stability.

Figure 2:
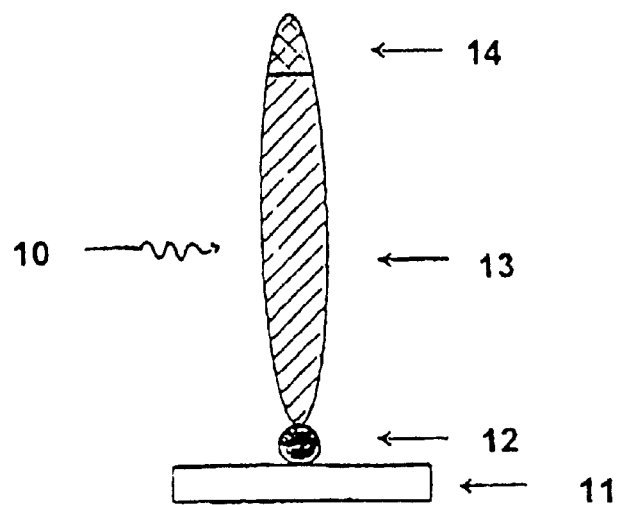
FIG. 2 is a schematic structural view of a molecule suitable for the self-adsorption process.

For clearer understanding of the chemisorption process, the structural make-up of the molecules used according to the invention will once more be explained in detail with reference to FIG. 2:

The alkanethiol molecule 10 represented in FIG. 2 of the general chemical formula R—SH, R standing for a substituted or unsubstituted alkane residue, has a structure suitable for the represented chemisorption process to take place.

The alkanethiol molecule 10 has three structural parts.

The first part of the alkanethiol molecule 10 is the anchoring or head group 12, which adjoins the metal plane 11 and interacts exothermally with the latter.

The second part of the alkanethiol molecule 10 is a long-chained alkyl chain 13 of variable length, for example water-soluble owing to appropriate substitution. The alkyl chains 13 of the alkanethiol molecules 10 interact with one another through van der Waals forces. The effect of the van der Waals interaction between the alkanethiol molecules is that they are aligned in parallel in their adsorbed state.

The third part of the alkanethiol molecule 10 forms the end group 14 which is directed outward, away from the metal surface 1, in its adsorbed state. The third part 14 determines the surface properties of the film formed by the alkanethiol molecules 10.

It will be readily understood that it is also possible to use dialkylsulfides (R—S—R), dialkylsulfides (R—S—S—R) or similar compounds, which meet the described prerequisites according to the invention, instead of the alkanethiol described.

The production of the passivation layer in the form of a monomolecular film, explained above, can be followed by a further process step. The film produced in one of the ways presented can be structured by exposure to UV light. To that end, the film is exposed to UV light through a mask. The exposure time depends on the energy density of the radiation source. While an exposure time of 60 minutes is necessary with exposure using a normal UV lamp, in order to obtain the desired structuring, the exposure times with exposure using an extra-high-pressure mercury lamp or using a laser are substantially shorter.

The exposure is followed by washing with high-purity deionized water and subsequent drying with nitrogen. The metal plane may then be connected to metal wires at the exposed locations.

Figure 3:
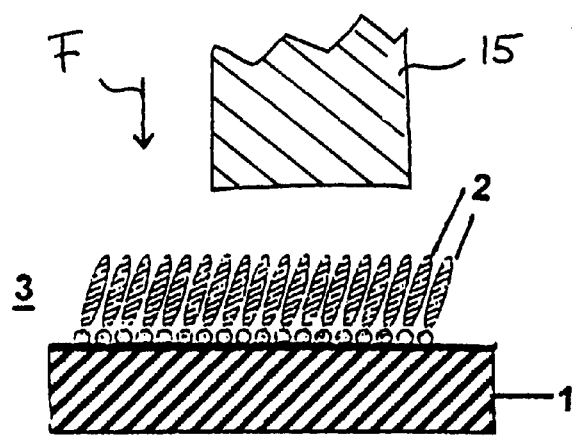
FIG. 3 is a diagrammatic illustration of a detail of an upper metal plane with a monomolecular film as it is being approached by a metal wire.

With reference to FIG. 3, a metal bonding wire 15 is pushed "through" to the monomolecular film formed of the molecules 2 in a direction along the arrow F. The force with which the wire 15 is pushed through the film and onto the metal surface 1 is adjusted so as to be sufficient to pierce the monomolecular film 2. This force will thus be adjusted as a function of the bond between the metal 1 and the film 2 after the film 2 has been appropriately prepared by UV exposure or the like at the locations at which the wire 15 is the pierce the film 2.

I claim:

1. A method of producing an integrated electrical circuit, which comprises:

forming at least one metal plane on a substrate;

wetting the metal plane with a solution for applying a passivation layer on the metal in the form of a monomolecular film made up of molecules containing an anchoring group; and subsequently connecting a metal wire to the metal plane with a pressure sufficient to pierce the monomolecular film.

2. The method according to claim 1, wherein the metal plane consists of a metal selected from the group consisting of copper, silver, and gold.

3. The method according to claim 1, wherein the anchoring group of the molecules of the monomolecular film is a thiol.

4. The method according to claim 3, wherein the molecules of the monomolecular film are alkanethiol molecules.

5. The method according to claim 1, wherein the anchoring group of the molecules of the monomolecular film is a sulfide.

6. The method according to claim 1, wherein the anchoring group of the molecules of the monomolecular film is a disulfide.

* * * * *